(12) United States Patent
Roy et al.

(10) Patent No.: US 11,001,535 B2
(45) Date of Patent: May 11, 2021

(54) TRANSFERRING NANOSTRUCTURES FROM WAFERS TO TRANSPARENT SUBSTRATES

(71) Applicant: Applied Materials, Inc., Santa Clara, CA (US)

(72) Inventors: Tapashree Roy, Bangalore (IN); Rutger Meyer Timmerman Thijssen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/452,136

(22) Filed: Jun. 25, 2019

(65) Prior Publication Data
US 2020/0339484 A1 Oct. 29, 2020

(30) Foreign Application Priority Data
Apr. 26, 2019 (IN) .............................. 201941016730

(51) Int. Cl.
*C04B 41/53* (2006.01)
*C04B 41/91* (2006.01)
(Continued)

(52) U.S. Cl.
CPC .......... *C04B 41/5338* (2013.01); *C04B 41/91* (2013.01); *C30B 33/10* (2013.01);
(Continued)

(58) Field of Classification Search
CPC ............... C04B 41/5338; C04B 41/91; H01L 21/30608; H01L 21/67075; H01L 21/3063;
(Continued)

(56) References Cited

U.S. PATENT DOCUMENTS 6,599,761 B2 * 7/2003 Hess .......................... B41J 2/16
257/E21.528
8,318,528 B2  11/2012 Kruglick
(Continued)

FOREIGN PATENT DOCUMENTS

JP    2009105252 A   5/2009
KR    20100062074 A  6/2010
KR    101878600 B1   7/2018

OTHER PUBLICATIONS

International Search Report and the Written Opinion for International Application No. PCT/US2020/019500 dated Jun. 19, 2020, 9 pages.
(Continued)

*Primary Examiner* — Duy Vu N Deo
(74) *Attorney, Agent, or Firm* — Patterson + Sheridan LLP

(57) ABSTRACT

Embodiments of the present disclosure generally relate to methods of forming optical devices comprising nanostructures disposed on transparent substrates. A substrate, such as a silicon wafer, is provided as a base for forming an optical device. A transparent layer is disposed on a first surface of the substrate, and a structure layer is disposed on the transparent surface. An etch mask layer is disposed on a second surface of the substrate opposite the first surface, and a window or opening is formed in the etch mask layer to expose a portion of the second surface of the substrate. A plurality of nanostructures is then formed in the structure layer, and a portion of the substrate extending from the window to the transparent layer is removed. A portion of the transparent layer having nanostructures disposed thereon is then detached from the substrate to form an optical device.

20 Claims, 9 Drawing Sheets

(51) Int. Cl.
*H01J 37/305* (2006.01)
*H01L 21/306* (2006.01)
*H01L 21/3063* (2006.01)
*H01L 21/67* (2006.01)
*C30B 33/10* (2006.01)

(52) U.S. Cl.
CPC ...... *H01J 37/3053* (2013.01); *H01L 21/3063* (2013.01); *H01L 21/30608* (2013.01); *H01L 21/67075* (2013.01); *H01J 2237/31749* (2013.01)

(58) Field of Classification Search
CPC .................. C30B 33/10; H01J 37/3053; H01J 2237/31749
USPC ...................................................... 216/65, 94
See application file for complete search history.

(56) References Cited

U.S. PATENT DOCUMENTS

2007/0160321 A1* 7/2007 Wu .................... G02B 6/12007
385/24
2009/0267173 A1* 10/2009 Takahashi ......... H01L 27/14625
257/434
2009/0298259 A1 12/2009 Ling et al.

OTHER PUBLICATIONS

Roy et al. "Dynamic metasurgace lens based on MEMS technology," APL Photonics 3, pp. 021302-1-,021302-7, 2018, https://doi.org/10.1063/1.5018865.
Roy et al. "Supplementary Information," Retrieved Jul. 31, 2020, 7 pages, https://aip.scitation.org/doi/ suppl/10.1063/1.5018865/suppl_file/lens-on-mems_supp+info_revised.docx.

* cited by examiner

TRANSFERRING NANOSTRUCTURES FROM WAFERS TO TRANSPARENT SUBSTRATES

CROSS-REFERENCE TO RELATED APPLICATIONS

This application claims the benefit of Indian Provisional Patent Application serial number 201941016730, filed Apr. 26, 2019, which is herein incorporated by reference.

BACKGROUND

Field

Embodiments of the present disclosure generally relate to methods of forming optical devices comprising nanostructures disposed on transparent substrates.

Description of the Related Art

Flat optical devices, also referred to as metasurfaces, are be used to manipulate the propagation of light by spatially varying structural parameters of the nanostructures (e.g., shape, size, orientation) formed on a substrate. The optical devices provide a spatially varying optical response that molds optical wavefronts as desired. These optical devices alter light propagation by inducing localized phase discontinuities (i.e., abrupt changes of phase over a distance smaller than the wavelength of the light). Such optical devices may be composed of different types of materials, shapes, or configurations on the substrate and may operate based upon different physical principles.

Transmissive flat optical devices in the visible and near-infrared spectrum typically require transparent substrates having nanostructures disposed thereon. In the semiconductor industry, processing silicon substrates to dispose nanostructures thereon is a well-understood process that comprises cost effective manufacturing steps. However, processing transparent substrates to form optical devices is both complex and expensive. For example, transparent substrates are generally considered to be challenging base substrates or structures for forming nanostructures on, as nanostructures with different materials, profiles, and configurations are often required in an attempt to meet different device performances for the optical devices. It is difficult to form nanoscale structures on transparent substrates having the desired profile cost-effectively while maintaining maximum optical performance and properties suitable of the intended optical devices.

Thus, there is a need in the art for methods of forming an optical device comprising nanostructures disposed on a silicon wafer and consequently transferring the structure layer onto a transparent substrate.

SUMMARY

Embodiments of the present disclosure generally relate to methods of forming optical devices comprising nanostructures disposed on transparent substrates. A substrate, such as a silicon wafer, is provided as a base for forming an optical device. A transparent layer is disposed on a first surface of the substrate, and a structure layer is disposed on the transparent surface. An etch mask layer is disposed on a second surface of the substrate opposite the first surface, and a window or opening is formed in the etch mask layer to expose a portion of the second surface of the substrate. A plurality of nanostructures is then formed in the structure layer, and a portion of the substrate extending from the window to the transparent layer is removed. A portion of the transparent layer having nanostructures disposed thereon is then detached from the substrate to form an optical device.

In one embodiment, a method of forming an optical device comprises depositing an etch mask layer on a first surface of a substrate, forming an opening in the etch mask layer to expose a portion of the first surface of the substrate, depositing a structure layer on a transparent layer, the transparent layer being disposed on a second surface of the substrate opposite the first surface, forming a plurality of nanostructures in the structure layer, etching a portion of the substrate extending from the opening in the etch mask layer to the transparent layer, and detaching a portion of the transparent layer having the plurality of nanostructures disposed thereon from the substrate to form an optical device.

In another embodiment, a method of forming an optical device comprises providing a silicon on insulator substrate as a base, the silicon on insulator substrate comprising a handle layer, a buried oxide layer disposed on a first surface of the handle layer, and a device layer disposed on the buried oxide layer, depositing an etch mask layer on a second surface of the handle layer opposite the first surface, forming an opening in the etch mask layer to expose a portion of the second surface of the handle layer, forming a plurality of nanostructures in the device layer, etching a portion of the handle layer extending from the opening in the etch mask layer to the buried oxide layer, and detaching a portion of the buried oxide layer having the plurality of nanostructures disposed thereon from the handle layer to form an optical device.

In yet another embodiment, a method of forming an optical device comprises providing a substrate as a base, the substrate comprising silicon, depositing an etch mask layer on a first surface of the substrate, forming an opening in the etch mask layer to expose a portion of the first surface of the substrate, depositing a transparent layer on a second surface of the substrate, the second surface being opposite the first surface, depositing a structure layer on the transparent layer, the structure layer comprising a material having a refractive index greater than about 1.8 and an absorption coefficient less than about 0.001, forming a plurality of nanostructures in the structure layer, depositing a protective layer over the plurality of nanostructures, etching a portion of the substrate extending from the opening in the etch mask layer to the transparent layer, and detaching a portion of the transparent layer having the plurality of nanostructures disposed thereon from the substrate to form an optical device.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to methods of forming optical devices comprising nanostructures disposed on transparent substrates. A substrate, such as a silicon wafer, is provided as a base for forming an optical device. A transparent layer is disposed on a first surface of the substrate, and a structure layer is disposed on the transparent surface. An etch mask layer is disposed on a second surface of the substrate opposite the first surface, and a window or opening is formed in the etch mask layer to expose a portion of the second surface of the substrate. A plurality of nanostructures is then formed in the structure layer, and a portion of the substrate extending from the window to the transparent layer is removed. A portion of the transparent layer having nanostructures disposed thereon is then detached from the substrate to form an optical device.

Figure 1:
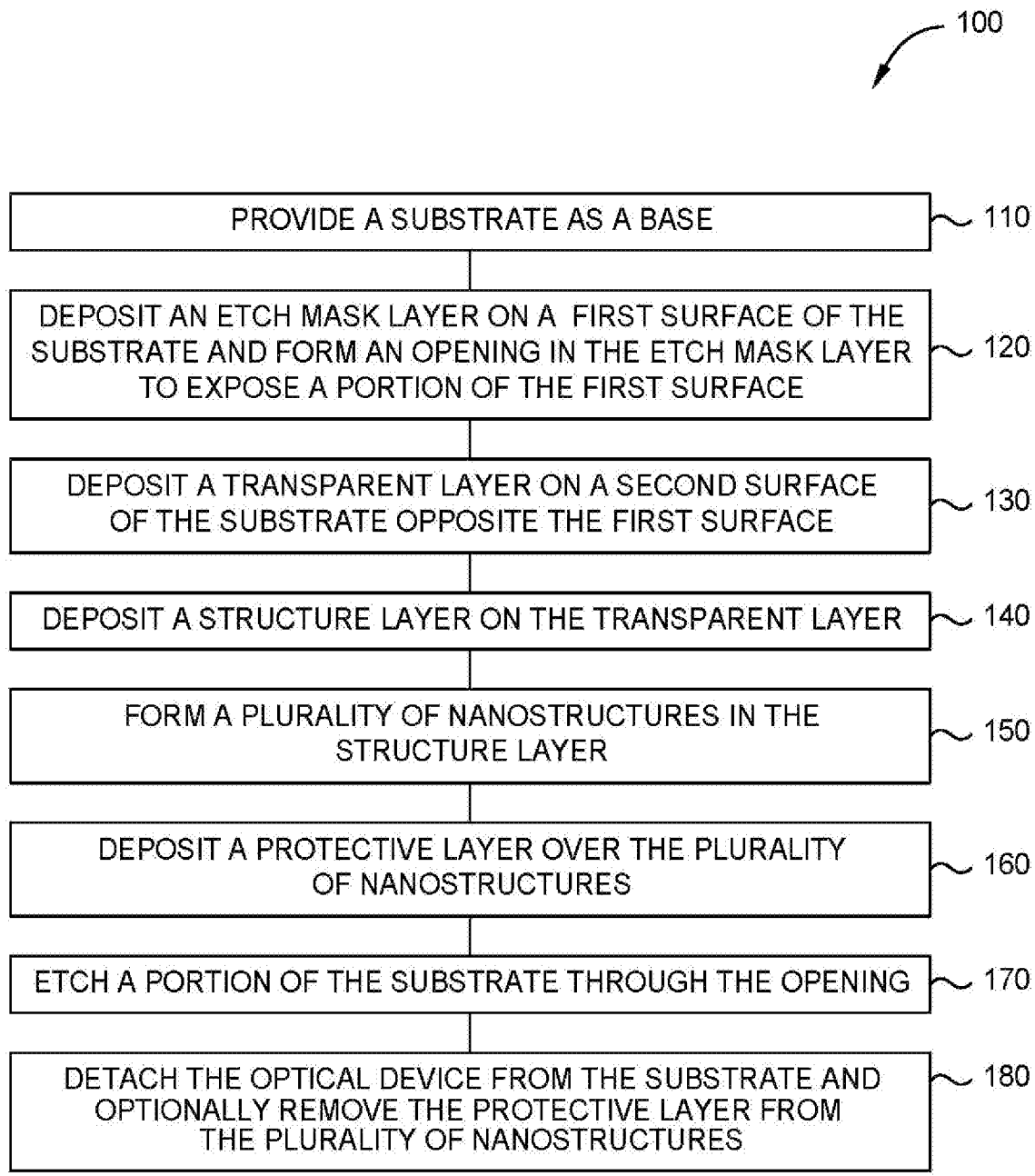
FIG. 1 illustrates a flow chart of a method of forming an optical device, according to one embodiment.
Figure 2A:
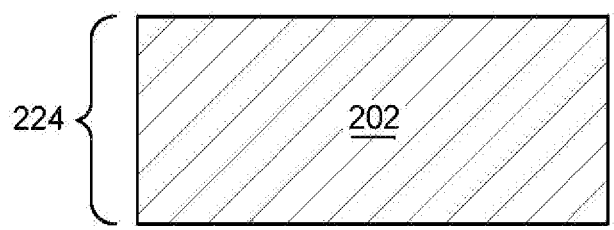
FIGS. 2A-2G illustrate schematic, cross-sectional views of an optical device formed according to the method of FIG. 1.

FIG. 1 illustrates a flow chart of a method 100 of forming an optical device 200 as shown in FIGS. 2A-2G. In operation 110, as shown in FIG. 2A, a substrate 202 or wafer is provided to act as a base for an optical device or nanodevice to be formed upon. The substrate 202 may comprise silicon. The substrate 202 may have a thickness 224 of about 200 microns to about 1000 microns.

Figure 2B:
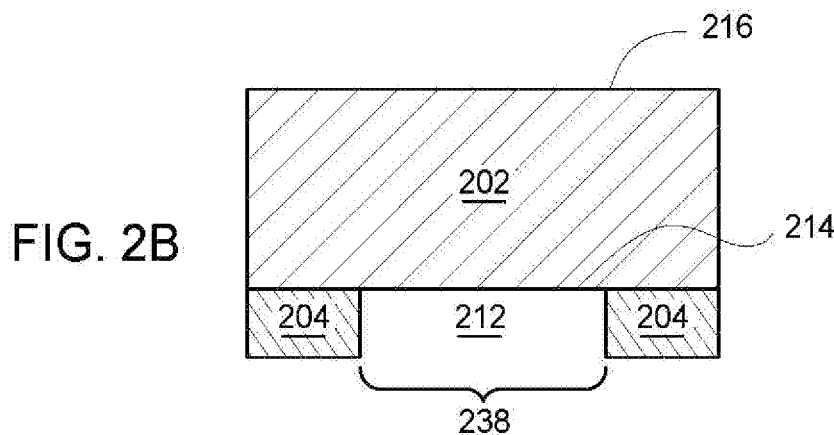

In operation 120, as shown in FIG. 2B, an etch mask layer 204 is deposited on a first surface 214 (e.g., a backside) of the substrate 202 and an opening 212 or window is formed in the etch mask layer 204 to expose a portion of the first surface 214 to span the thickness 224 of the substrate 202. The opening 212 may be formed by depositing the etch mask layer 204 on the first surface 214 of the substrate 202 and etching a portion of the etch mask layer 204 to expose a portion of the first surface 214 of the substrate 202 within the opening 212. The etch mask layer 204 may be an oxide layer. The etch mask layer 204 may be deposited using any suitable method or process, and may comprise any suitable material containing an oxide, such as silicon dioxide. The etch mask layer 204 may comprise any material having a high etch selectivity to silicon or the substrate material, as well as being easily patternable. For example, if the substrate 202 comprises silicon, the etch mask layer 204 may comprise a photoresist comprising Al, Cu, Mo, Ni, Pt, or Ti. The choice of the etch mask layer 204 material may also depend on the etch process selected, such as a dry etch with xenon difluoride, or a wet etch with tetramethylammonium hydroxide (TMAH) or potassium hydroxide (KOH).

The opening 212 has a length or width 238 of about 5 microns to about 5 centimeters. The opening 212 is formed to be aligned with a nanodevice or optical device 200 (shown in FIG. 2G) formed on a second surface 216 (e.g., a topside) of the substrate 202 that is opposite the first surface 214, and the width 238 of the opening 212 should be slightly larger than that of the optical device 200. The width 238 of the opening 212 may define the width of the optical device 200. To protect the second surface 216 while forming the opening 212, a protective layer (not shown), such as a nitride layer, may be deposited on the second surface 216 prior to depositing the etch mask layer 204 on the first surface 214. The protective layer may then be removed once the opening 212 is formed.

Figure 2C:
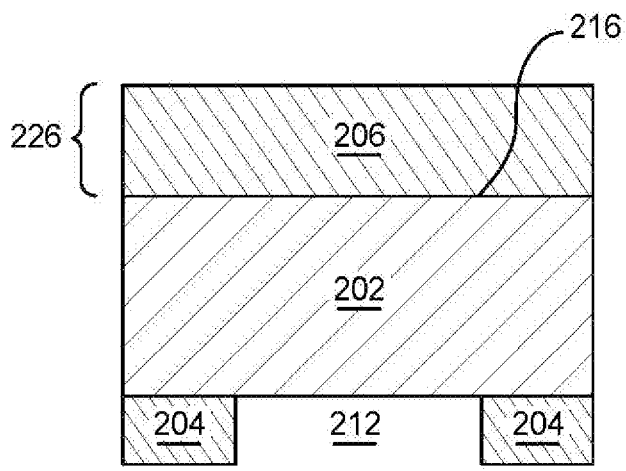

In operation 130, as shown in FIG. 2C, a transparent layer 206 is deposited on the second surface 216 of the substrate 202. In one embodiment, the transparent layer 206 comprises an oxide material, such as silicon dioxide. The transparent layer 206 may have a thickness 226 of about 5 microns to about 5 centimeters. The transparent layer 206 may be deposited on the second surface 216 using a liquid material pour casting process, a spin-on coating process, a liquid spray coating process, a physical vapor deposition (PVD) process, a chemical vapor deposition (CVD) process, a plasma-enhanced (PECVD) process, a flowable CVD (FCVD) process, or an atomic layer deposition (ALD) process.

The material of the transparent layer 206 may be selected to transmit a suitable amount of light of a desired wavelength or wavelength range, such as one or more wavelengths in the UV region to the infrared region (i.e., from about 300 nm to about 2000 nm). Without limitation, in some embodiments, the transparent layer 206 is configured such that the transparent layer 206 transmits greater than or equal to about 50%, 60%, 70%, 80%, 90%, 95%, 99%, to UV region of the light spectrum. The transparent layer 206 may be formed from any suitable material, provided that the transparent layer 206 can adequately transmit light in a desired wavelength or wavelength range and can serve as an adequate support for the optical devices. In some embodiments, which can be combined with other embodiments described herein, the material of transparent layer 206 has a refractive index that is relatively low, as compared to the refractive index of a structure layer 208 (described in operation 140 and shown in FIG. 2D). The transparent layer 206 may comprise any suitable material, including, but not limited to, amorphous dielectrics, crystalline dielectrics, silicon oxide, polymers, and combinations thereof. In one embodiment, which can be combined with other embodiments described herein, the transparent layer 206 has an absorption coefficient smaller than 0.001. Suitable examples may include an oxide, sulfide, phosphide, telluride, or combinations thereof.

Figure 2D:
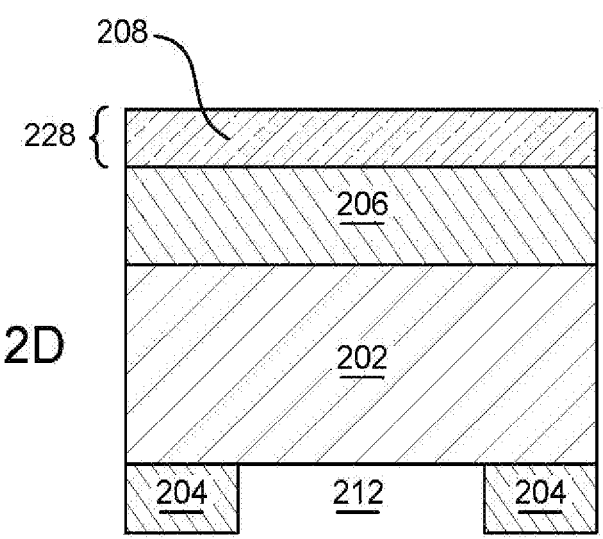

In operation 140, as shown in FIG. 2D, a structure layer 208 is deposited on the transparent layer 206. The structure layer 208 may have a thickness 228 of about 200 nm to about 2000 nm. The structure layer 208 may comprise any suitable material having a refractive index greater than about 1.8 and an absorption coefficient less than about 0.001. The structure layer 208 may comprise a material selected from the group consisting of titanium dioxide ($TiO_2$), gallium phosphide (GaP), gallium nitride (GaN), zinc oxide (ZnO), tin dioxide ($SnO_2$), aluminum-doped zinc oxide (AZO), crystalline silicon (c-Si), and silicon nitride ($Si_3N_4$). The structure layer 208 may be deposited on the transparent layer 206 using a liquid material pour casting process, a spin-on coating process, a liquid spray coating process, a PVD process, a CVD process, a PECVD process, a FCVD process, or an ALD process.

Figure 2E:
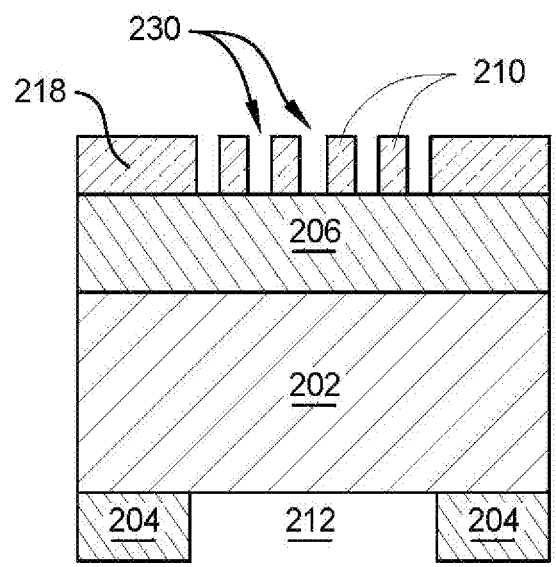

In operation 150, as shown in FIG. 2E, a plurality of nanostructures 210 is formed in the structure layer 208. The nanostructures 210 are formed by patterning the structure layer 208 to remove portions 230 of the structure layer 208, where each nanostructure 210 is spaced from an adjacent nanostructure 210 by a removed portion 230 of the structure layer 208. In one embodiment, the nanostructures 210 are formed by stamping the structure layer 208 with a nanoimprint stamp. In another embodiment, the nanostructures 210 are formed though a lithography process or etching process, such as a dry etching process, ion implantation, ion etching, reactive ion etching (RIE), directional RIE, laser etching, and selective wet chemical etching. One or more of the nanostructures 210 may have a height equal to the thickness 228 of the structure layer 208. In one embodiment, which can be combined with other embodiments described herein, the nanostructures 210 may have the same dimensions, such as height and width. In another embodiment, which can be combined with other embodiments described herein, at least one of the nanostructures 210 may have at least one different dimension, such as one of height and width, from the dimensions of the additional nanostructures 210. In one example, each of the dimensions of the nanostructures 210 has a dimension less than about 2000 nm, for example, less than about 500 nm, less than about 400 nm, less than about 200 nm, or even less than about 40 nm.

While four nanostructures 210 are illustrated, any number of nanostructures 210 may be formed in the structure layer 208 as needed, and the number of nanostructures 210 included is not intended to be limiting. After the nanostructures 210 are formed, excess structure material 218 of the structure layer 208 may be disposed on either side of the nanostructures 210.

Figure 2F:
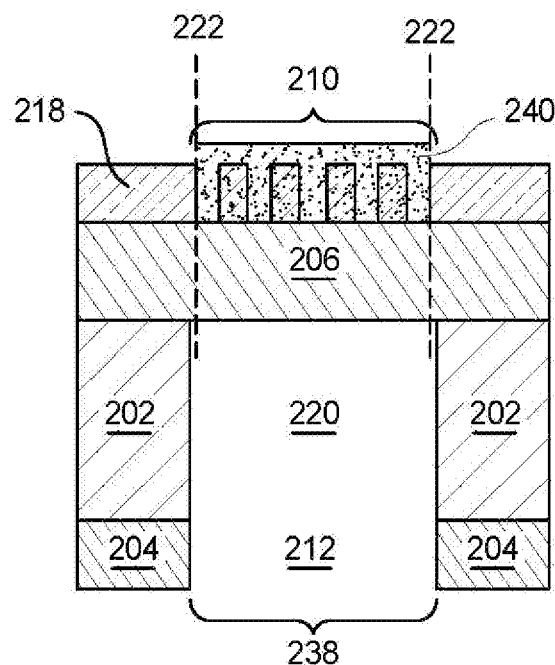

In operation 160, as shown in FIG. 2F, the nanostructures 210 are coated with a protective layer 240. The protective layer 240 is an easily removable protective layer, such as a photoresist. The protective layer 240 may be deposited using a spin coating method. The protective layer 240 protects the nanostructures 210 during operations 170 and 180. The protective layer 240 may act as an encapsulation layer for the nanodevice. The protective layer 240 may comprise a low refractive index transparent material, such as a material having a refraction index (RI) of about 1.5 and an absorption coefficient of about 0.001.

In operation 170, as shown in FIG. 2F, a portion 220 of the substrate 202 is removed through the opening 212, the portion 220 extending from the opening 212 to the transparent layer 206. The portion 220 further has the same width 238 as the opening 212. The portion 220 of the substrate 202 may be removed through a dry etch process or a wet etch process. The substrate 202 may be etched using an etchant comprising xenon difluoride, TMAH, or KOH. The etchant used to remove the portion 220 of the substrate 202 may have a high selectivity to etch silicon as compared to silicon dioxide, allowing a transparent layer 206 comprising silicon dioxide to act as an etch stop. Thus, the portion 220 of the substrate 202 removed extends to the transparent layer 206, as the transparent layer 206 acts as an etch stop for the etching process.

Figure 2G:
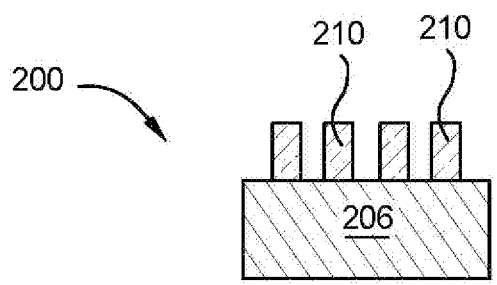

In operation 180, as shown in FIG. 2G, an optical device 200 or nanodevice is detached from the substrate 202, and the protective layer 240 deposited over the nanostructures 210 in operation 160 is optionally removed. The optical device 200 is further detached from any excess structure material 218. The optical device 200 may be detached by cutting along the lines 222 of FIG. 2F, such as with a blade, a laser, or a focused ion beam. The lines 222 are aligned with the opening 212 and the removed portion 220 of the substrate 202. In other words, the lines 222 are disposed a distance away from one another equal to the width 238 of the opening 212. Thus, the portion of the transparent layer 206 and nanostructures 210 disposed between the lines 222 forms the optical device 200. The resulting optical device 200 is flat and comprises a plurality of nanostructures 210 disposed on a transparent layer 206, the nanostructures 210 being comprised of a material having a high refractive index and a low absorption coefficient. If the protective layer 240 is not removed, the protective layer 240 acts as an encapsulation layer for the nanostructures 210.

Figure 3:
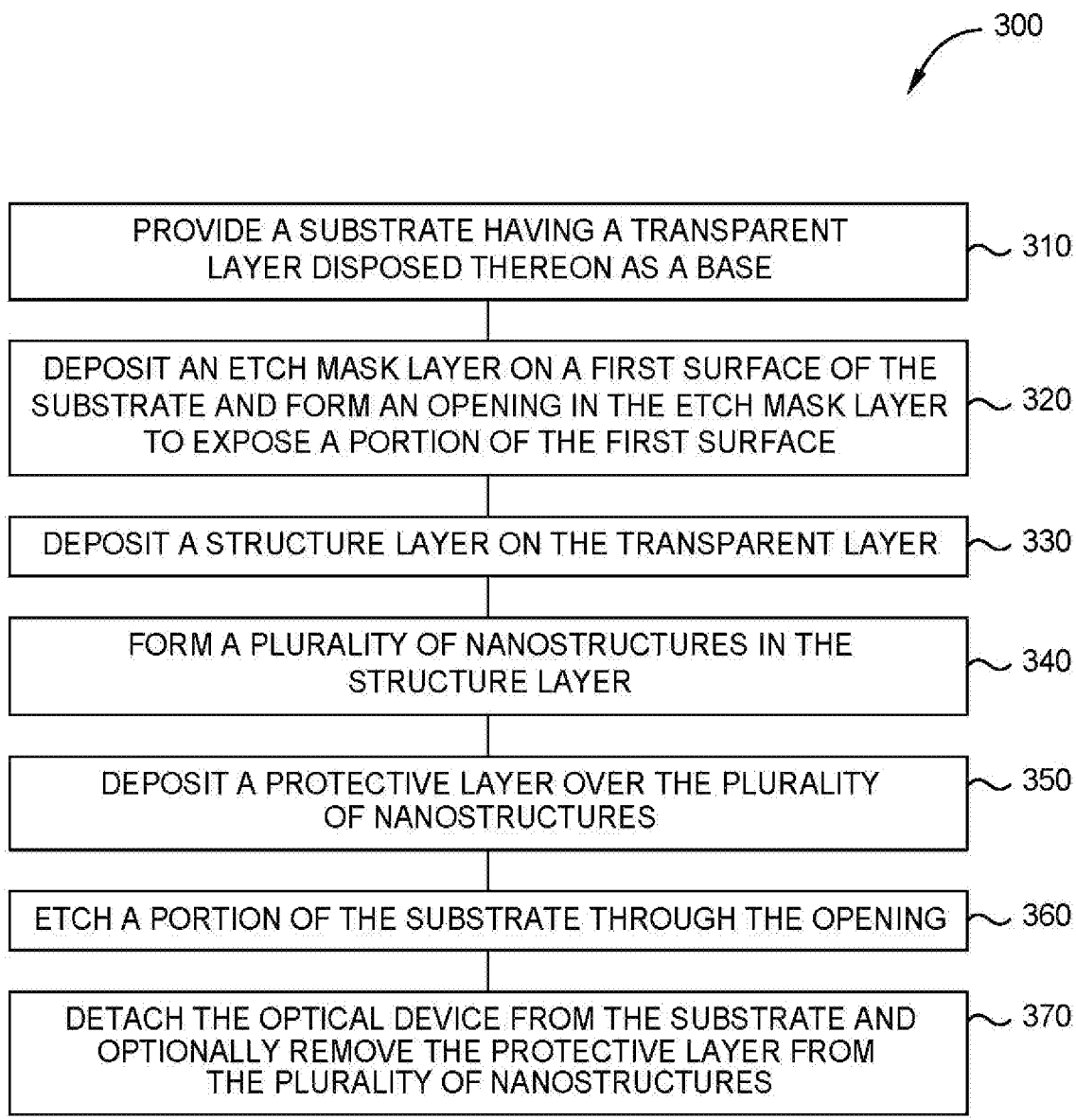
FIG. 3 illustrates a flow chart of a method of forming an optical device, according to another embodiment.
Figure 4A:
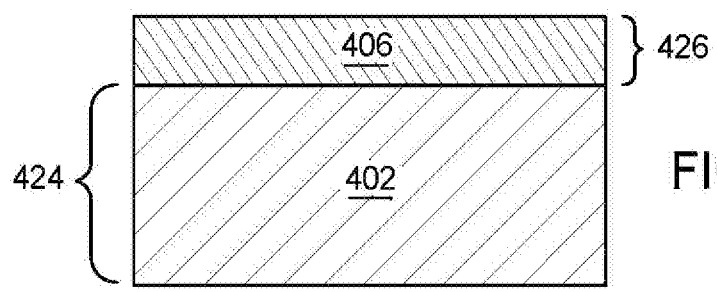
FIGS. 4A-4F illustrate schematic, cross-sectional views of an optical device formed according to the method of FIG. 3.

FIG. 3 illustrates a flow chart of another method 300 of forming an optical device 400 as shown in FIGS. 4A-4F. In operation 310, as shown in FIG. 4A, a substrate 402 or wafer having a transparent layer 406 disposed thereon is provided to act as a base for a nanodevice to be formed upon. The substrate 402 having the transparent layer 406 disposed thereon may be manufactured as a single unit. The substrate 402 may comprise silicon. The substrate 402 may have a thickness 424 of about 200 microns to about 1000 microns. The transparent layer 406 may comprise an oxide material, such as silicon dioxide. The transparent layer 406 may have a thickness 426 of about 5 microns to about 5 centimeters. The transparent layer 406 may be the transparent layer 206 of FIGS. 2A-2G.

Figure 4B:
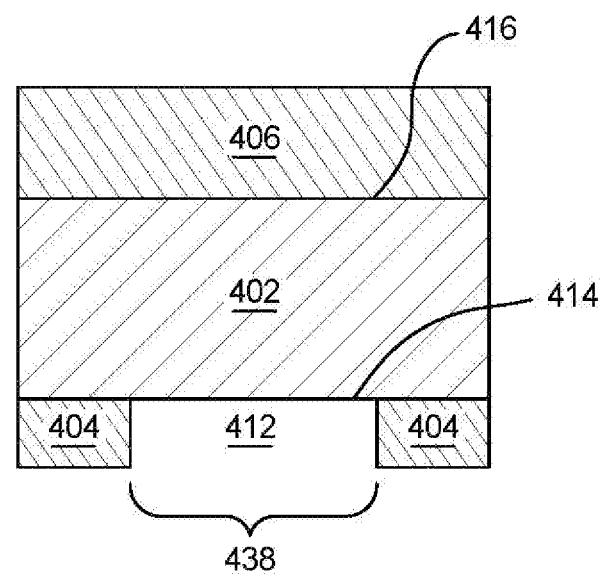

In operation 320, as shown in FIG. 4B, an etch mask layer 404 is deposited on a first surface 414 (e.g., a backside) of the substrate 402 and an opening 412 or window is formed in the etch mask layer 404 to expose a portion of the first surface 414 to span the thickness 424 of the substrate 402. The first surface 414 of the substrate 402 is disposed opposite the transparent layer 406. The opening 412 may be formed by depositing the etch mask layer 404 on the first surface 414 of the substrate 402 and etching a portion of the etch mask layer 404 to expose a portion of the first surface 414 of the substrate 402 within the opening 412. The etch mask layer 404 may be deposited using any suitable method or process, and may comprise any suitable material containing an oxide, such as silicon dioxide. The etch mask layer 404 may be an oxide layer. The etch mask layer 404 may comprise any material having a high etch selectivity to silicon or the substrate material, as well as being easily patternable. For example, if the substrate 402 comprises silicon, the etch mask layer 404 may comprise a photoresist comprising Al, Cu, Mo, Ni, Pt, or Ti. The choice of the etch mask layer 404 material may also depend on the etch process selected, such as a dry etch with xenon difluoride, or a wet etch with TMAH or KOH.

The opening 412 has a length or width 438 of about 5 microns to about 500 microns. The opening 412 is formed to be aligned with a nanodevice or optical device 400 (shown in FIG. 4F) formed on the second surface 416 of the substrate 402, and the width 438 of the opening 412 should be slightly larger than that of the optical device 400. The width 438 of the opening 412 may define the width of the optical device 400. To protect the second surface 416 while forming the opening 412, a protective layer (not shown), such as a nitride layer, may be deposited on the second surface 416 prior to depositing the etch mask layer 404 on the first surface 414. The protective layer may then be removed once the opening 412 is formed.

Figure 4C:
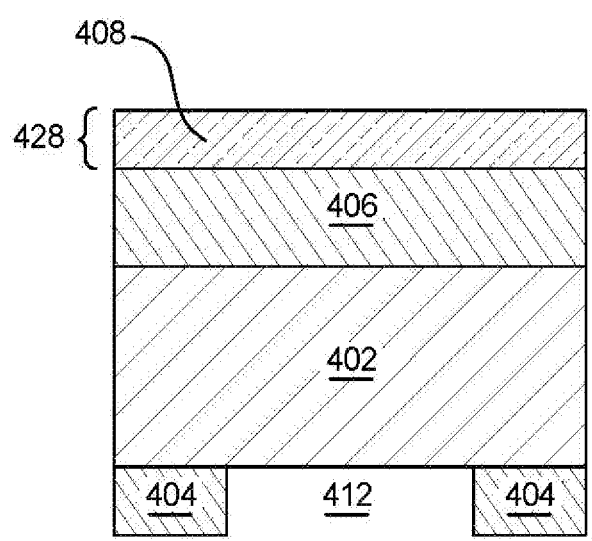

In operation 330, as shown in FIG. 4C, a structure layer 408 is deposited on the transparent layer 406. The structure layer 408 may have a thickness 228 of about 200 nm to about 2000 nm. The structure layer 408 may be comprised of any suitable material having a refractive index greater than about 1.8 and an absorption coefficient less than about 0.001. The structure layer 408 may comprise a material selected from the group consisting of titanium dioxide (TiO$_2$), gallium phosphide (GaP), gallium nitride (GaN), zinc oxide (ZnO), tin dioxide (SnO$_2$), aluminum-doped zinc oxide (AZO), crystalline silicon (Si), silicon nitride (Si$_3$N$_4$), fluorine-doped tin oxide (FTO), cadmium stannate (tin oxide) (CTO), and zinc stannate (tin oxide) (SnZnO$_3$). The structure layer 408 may be deposited on the transparent layer 406 using a liquid material pour casting process, a spin-on coating process, a liquid spray coating process, a dry powder coating process, a screen printing process, a doctor blading process, a PVD process, a CVD process, a PECVD process, a FCVD process, or an ALD process.

Figure 4D:
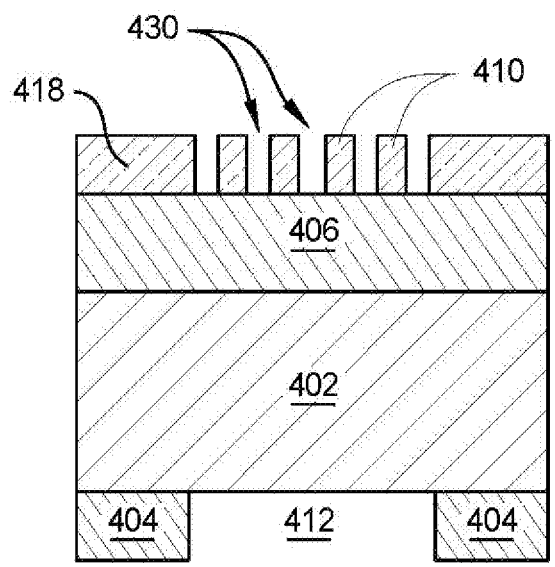

In operation 340, as shown in FIG. 4D, a plurality of nanostructures 410 is formed in the structure layer 408. The nanostructures 410 are formed by patterning the structure layer 408 to remove portions 430 of the structure layer 408, where each nanostructure 410 is spaced from an adjacent nanostructure 410 by a removed portion 430 of the structure layer 408. In one embodiment, the nanostructures 410 are formed by stamping the structure layer 408 with a nanoimprint stamp. In another embodiment, the nanostructures 410 are formed though a lithography process or etching process, such as a dry etching process, ion implantation, ion etching, RIE, directional RIE, microblasting, waterjet cutting, laser etching, and selective wet chemical etching.

One or more of the nanostructures 410 may have a height equal to the thickness 428 of the structure layer 408. In one embodiment, which can be combined with other embodiments described herein, the nanostructures 410 may have the same dimensions, such as height and width. In another embodiment, which can be combined with other embodiments described herein, at least one of the nanostructures 410 may have at least one different dimension, such as one of height and width, from the dimensions of the additional nanostructures 410. In one example, each of the dimensions of the nanostructures 410 has a dimension less than about 2000 nm, for example, less than about 500 nm, less than about 400 nm, less than about 200 nm, or even less than about 40 nm.

While four nanostructures 410 are illustrated, any number of nanostructures 410 may be formed in the structure layer 408 as needed, and the number of nanostructures 410 included is not intended to be limiting. After the nanostructures 410 are formed, excess structure material 418 of the structure layer 408 may be disposed on either side of the nanostructures 410.

Figure 4E:
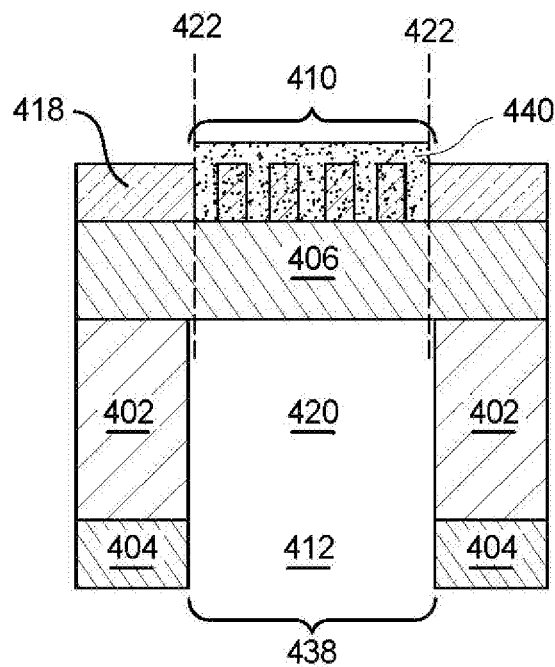

In operation 350, as shown in FIG. 4E, the nanostructures 410 are coated with a protective layer 440. The protective layer 440 is an easily removable protective layer, such as a photoresist. The protective layer 440 may be deposited using a spin coating method. The protective layer 440 protects the nanostructures 410 during operations 360 and 370. The protective layer 440 may act as an encapsulation layer for the nanodevice. The protective layer 440 may comprise a low refractive index transparent material, such as a material having a refraction index (RI) of about 1.5 and an absorption coefficient of about 0.001.

In operation 360, as shown in FIG. 4E, a portion 420 of the substrate 402 is removed through the opening 412, the portion 420 extending from the opening 412 to the transparent layer 406. The portion 420 further has the same width 438 as the opening 412. The portion 420 of the substrate 402 may be removed through a dry etch process. The substrate 402 may be etched using an etchant comprising xenon difluoride. The etchant used to remove the portion 420 of the substrate 402 may have a high selectivity to etch silicon as compared to silicon dioxide, allowing a transparent layer 406 comprising silicon dioxide to act as an etch stop. Thus, the portion 420 of the substrate 402 removed extends to the transparent layer 406, as the transparent layer 406 acts as an etch stop for the etching process.

Figure 4F:
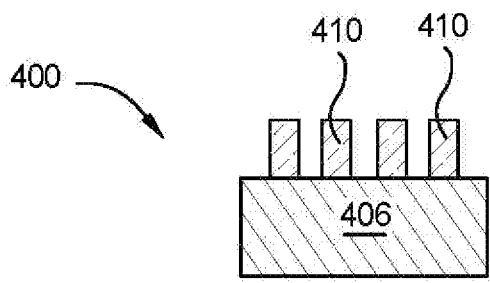

In operation 370, as shown in FIG. 4F, an optical device 400 or nanodevice is detached from the substrate 402, and the protective layer 440 deposited over the nanostructures 410 in operation 350 is optionally removed. The optical device 400 is further detached from any excess structure material 418. The optical device 400 may be detached by cutting along the lines 422 of FIG. 4E, such as with a blade or laser. The lines 422 are aligned with the opening 412 and the removed portion 420 of the substrate 402. In other words, the lines 422 are disposed a distance away from one another equal to the width 438 of the opening 412. Thus, the portion of the transparent layer 406 and nanostructures 410 disposed between the lines 422 forms the optical device 400. The resulting optical device 400 is flat and comprises a plurality of nanostructures 410 disposed on a transparent layer 406, the nanostructures 410 being comprised of a material having a high refractive index and a low absorption coefficient. If the protective layer 440 is not removed, the protective layer 440 acts as an encapsulation layer for the nanostructures 410.

Figure 5:
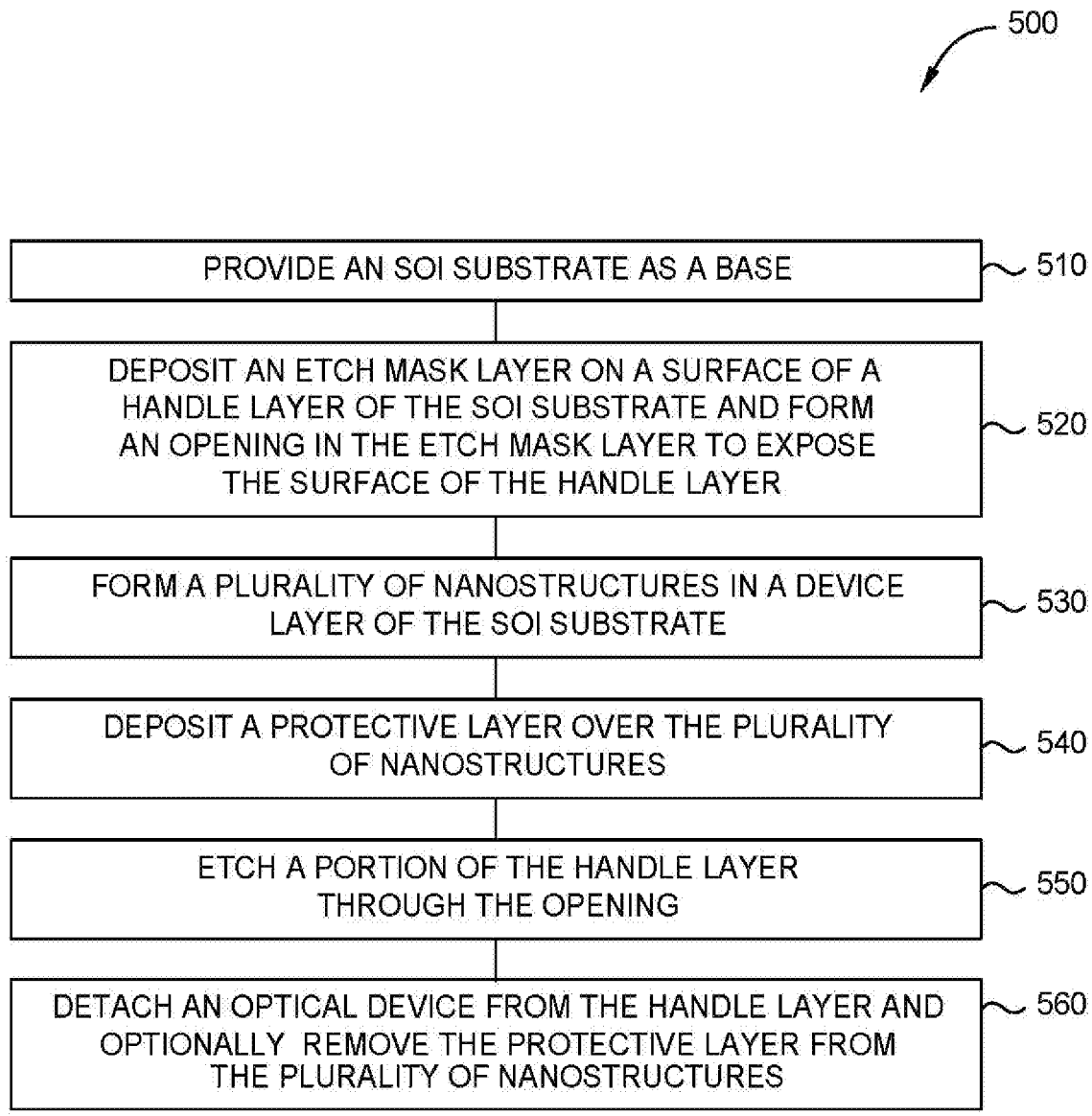
FIG. 5 illustrates a flow chart of a method of forming an optical device, according to yet another embodiment.
Figure 6A:
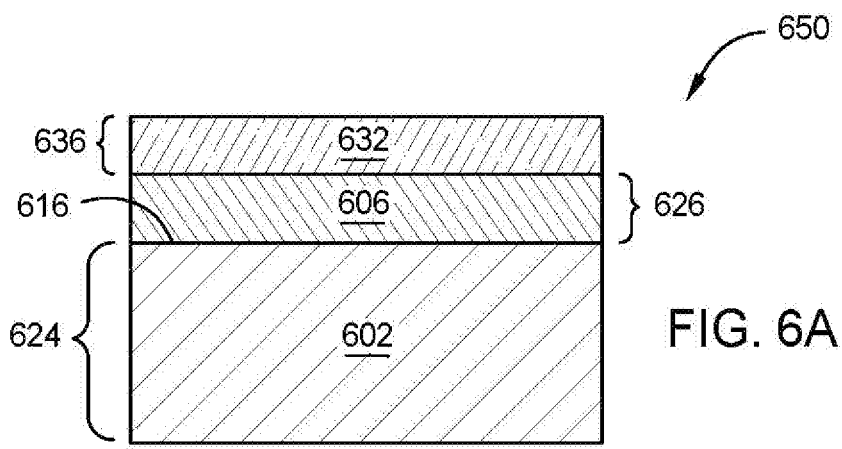
FIGS. 6A-6E illustrate schematic, cross-sectional views of an optical device formed according to the method of FIG. 5.

FIG. 5 illustrates a flow chart of yet another method 500 of forming an optical device 600 as shown in FIGS. 6A-6E. In operation 510, as shown in FIG. 6A, a silicon on insulator (SOI) substrate 650 is provided to act as a base for a nanodevice to be formed upon. The SOI substrate 650 comprises a handle layer 602 or wafer, a buried oxide layer 606 disposed on a first surface 616 of the handle layer 602, and a device layer 632 disposed on the buried oxide layer 606. The handle layer 602 may be referred to as a silicon containing substrate, the buried oxide layer 606 may be referred to as a transparent layer, and the device layer 632 may be referred to as a silicon containing layer. The SOI substrate 650 may be manufactured as a single unit. The handle layer 602 may comprise silicon and have a thickness 624 of about 100 microns to about 1000 microns. The buried oxide layer 606 may comprise an oxide material, such as silicon dioxide. The buried oxide layer 606 may have a thickness 626 of about 100 microns to about 1000 microns. The buried oxide layer 606 may be the transparent layer 206 of FIGS. 2A-2G. The device layer 632 may comprise crystalline silicon, or amorphous silicon (a-Si). The device layer 632 may have a thickness 636 of about 100 nanometers to about 1000 nanometers.

Figure 6B:
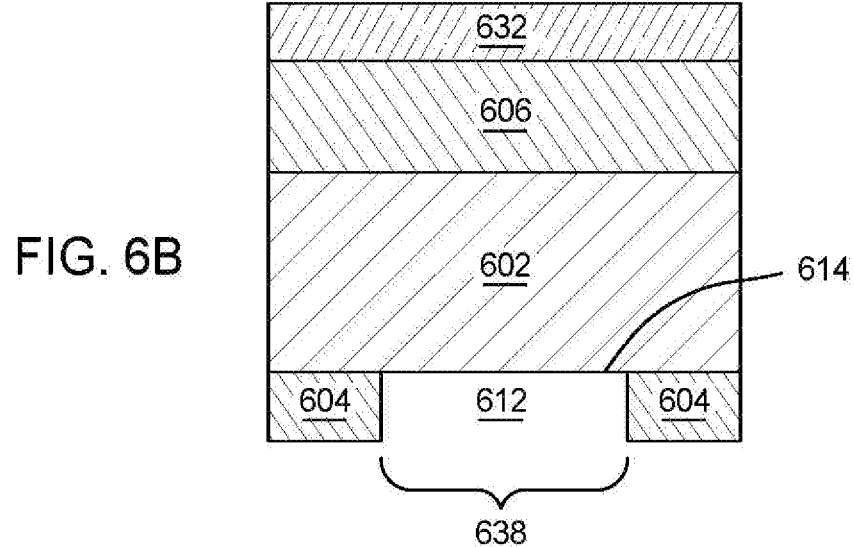

In operation 520, as shown in FIG. 6B, an etch mask layer 604 is deposited on a second surface 614 (e.g., a backside) of the handle layer 602 and an opening 612 or window is formed in the etch mask layer 604 to expose the second surface 614. The second surface 614 of the handle layer 602 is opposite the first surface 616. The opening 612 may be formed by depositing the etch mask layer 604 on the second surface 614 of the handle layer 602 and etching a portion of the etch mask layer 604 to expose a portion of the second surface 614 of the handle layer 602 within the opening 612. The etch mask layer 604 may be deposited using any suitable method or process, and may comprise any suitable material containing an oxide, such as silicon dioxide. The etch mask layer 604 may be an oxide layer. The etch mask layer 604 may comprise any material having a high etch selectivity to silicon or the substrate material, as well as being easily patternable. For example, if the handle layer 602 comprises silicon, the etch mask layer 604 may comprise a photoresist comprising Al, Cu, Mo, Ni, Pt, or Ti. The choice of the etch mask layer 604 material may also depend on the etch process selected, such as a dry etch with xenon difluoride, or a wet etch with TMAH or KOH.

The opening 612 has a length or width 638 of about 5 microns to about 500 microns. The opening 612 is formed to be aligned with a nanodevice or optical device 600 (shown in FIG. 6E) formed on the first surface 616 of the handle layer 602, and the width 638 of the opening 612 should be slightly larger than that of the optical device 600. The width 638 of the opening 612 may define the width of the optical device 600. To protect the first surface 616 while forming the opening 612, a protective layer (not shown), such as a nitride layer, may be deposited on the first surface 616 prior to depositing the etch mask layer 604 on the second surface 614. The protective layer may then be removed once the opening 612 is formed.

Figure 6C:
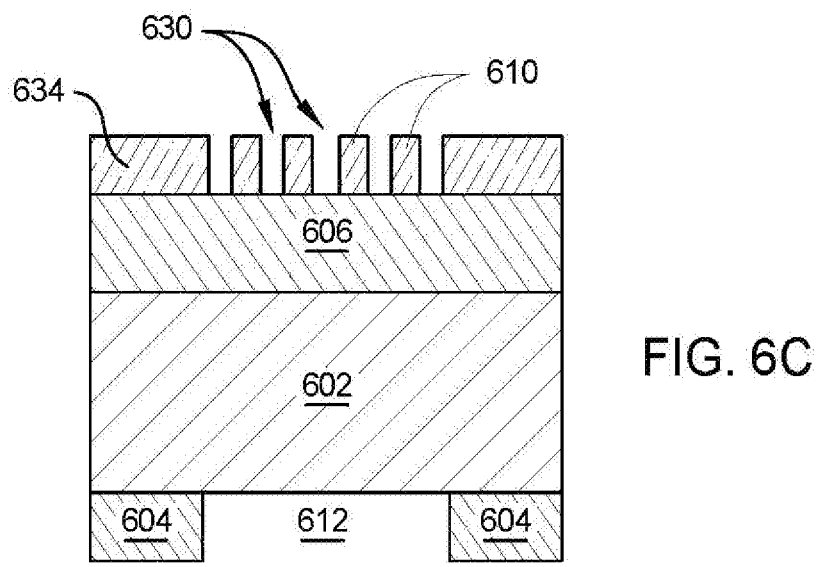

In operation 530, as shown in FIG. 6C, a plurality of nanostructures 610 is formed in the device layer 632. The nanostructures 610 are formed by patterning the device layer 632 to remove portions 630 of the device layer 632, where each nanostructure 610 is spaced from an adjacent nanostructure 610 by a removed portion 630 of the device layer 632. In one embodiment, the nanostructures 610 are formed by stamping the device layer 632 with a nanoimprint stamp. In another embodiment, the nanostructures 610 are formed though a lithography process or etching process, such as a dry etching process, ion implantation, ion etching, RIE, directional RIE, laser etching, and selective wet chemical etching. In some embodiments, nanostructures formed of silicon or a silicon containing material may be desired, such as for near infrared devices or for wavelengths of red and beyond (i.e., about 600 nm to about 1500 nm).

One or more of the nanostructures 610 may have a height equal to the thickness 628 of the device layer 632. In one embodiment, which can be combined with other embodiments described herein, the nanostructures 610 may have the same dimensions, such as height and width. In another embodiment, which can be combined with other embodiments described herein, at least one of the nanostructures 610 may have at least one different dimension, such as one of height and width, from the dimensions of the additional nanostructures 610. In one example, each of the dimensions of the nanostructures 610 has a dimension less than about 2000 nm, for example, less than about 500 nm, less than about 400 nm, less than about 200 nm, or even less than about 40 nm.

While four nanostructures 610 are illustrated, any number of nanostructures 610 may be formed in the device layer 632 as needed, and the number of nanostructures 610 included is not intended to be limiting. After the nanostructures 610 are formed, excess material 634 of the device layer 632 may be disposed on either side of the nanostructures 610.

Figure 6D:
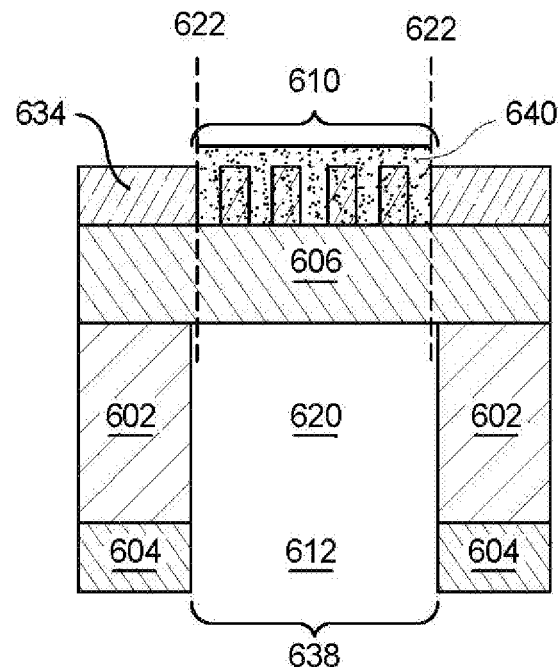

In operation 540, as shown in FIG. 6D, the nanostructures 610 are coated with a protective layer 640. The protective layer 640 is an easily removable protective layer, such as a photoresist. The protective layer 640 may be deposited using a spin coating method. The protective layer 640 protects the nanostructures 610 during operation 550. The protective layer 640 may act as an encapsulation layer for the nanodevice. The protective layer 640 may comprise a low refractive index transparent material, such as a material having a refraction index (RI) of about 1.5 and an absorption coefficient of about 0.001.

In operation 550, as shown in FIG. 6D, a portion 620 of the handle layer 602 is removed through the opening 612, the portion 620 extending from the opening 612 to the buried oxide layer 606 to span the thickness 624 of the handle layer 602. The portion 620 further has the same width 638 as the opening 612. The portion 620 of the handle layer 602 may be removed through a dry etch process. The handle layer 602 may be etched using an etchant comprising xenon difluoride. The etchant used to remove the portion 620 of the handle layer 602 may have a high selectivity to etch silicon as compared to silicon dioxide, allowing a buried oxide layer 606 comprising silicon dioxide to act as an etch stop. Thus, the portion 620 of the handle layer 602 removed extends to the buried oxide layer 606, as the buried oxide layer 606 acts as an etch stop for the etching process.

Figure 6E:
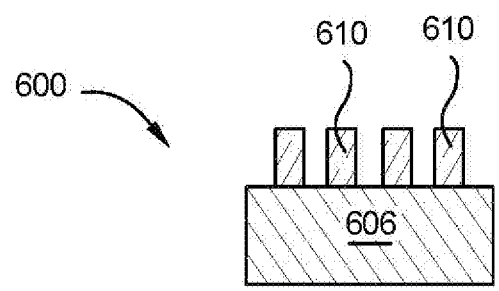

In operation 560, as shown in FIG. 6E, an optical device 600 or nanodevice is detached from the handle layer 602, and the protective layer 640 deposited over the nanostructures 610 in operation 540 is optionally removed. The optical device 600 is further detached from any excess material 634. The optical device 600 may be detached by cutting along the lines 622 of FIG. 6D, such as with a blade, a laser, or a focused ion beam. The lines 622 are aligned with the opening 612 and the removed portion 620 of the handle layer 602. In other words, the lines 622 are disposed a distance away from one another equal to the width 638 of the opening 612. Thus, the portion of the buried oxide layer 606 and nanostructures 610 disposed between the lines 622 forms the optical device 600. The resulting optical device 600 is flat and comprises a plurality of nanostructures 610 disposed on a buried oxide layer 606. If the protective layer 640 is not removed, the protective layer 640 acts as an encapsulation layer for the nanostructures 610.

The above-described methods enable nanostructures to be formed on a transparent layer disposed on a base substrate, rather than solely on a transparent substrate. The base substrate is then removed to form an optical device comprising a plurality of nanostructures disposed on a transparent layer. As processing transparent substrates or layers can be both expensive and difficult, the above-described methods allow optical devices to be formed in a straight-forward and cost-efficient manner. Furthermore, the above-described methods form flat optical devices in the visible and near-infrared wavelengths comprising nanostructures comprised of a material having a high refractive index and a low absorption coefficient disposed on a transparent layer.

While the foregoing is directed to examples of the present disclosure, other and further examples of the disclosure may be devised without departing from the basic scope thereof, and the scope thereof is determined by the claims that follow.

What is claimed is:

1. A method of forming an optical device, comprising:
depositing an etch mask layer on a first surface of a substrate;
forming an opening in the etch mask layer to expose a portion of the first surface of the substrate;
depositing a structure layer on a transparent layer, the transparent layer being disposed on a second surface of the substrate opposite the first surface;
forming a plurality of nanostructures in the structure layer over the opening in the etch mask layer;
depositing a protective layer over the plurality of nanostructures;
etching a portion of the substrate extending from the opening in the etch mask layer to the transparent layer; and
detaching a portion of the transparent layer having the plurality of nanostructures disposed thereon from the substrate to form an optical device, the detached portion of the transparent layer being aligned with the opening in the etch mask layer.

2. The method of claim 1, wherein the transparent layer is deposited on the second surface of the substrate prior to depositing the structure layer.

3. The method of claim 1, further comprising:
providing the substrate having the transparent layer disposed on the second surface as a base prior to depositing the etch mask layer; and
removing the protective layer after detaching the portion of the transparent layer having the plurality of nanostructures disposed thereon.

4. The method of claim 1, wherein the structure layer comprises a material having a refractive index greater than about 1.8 and an absorption coefficient less than about 0.001.

5. The method of claim 1, wherein the structure layer comprises a material selected from the group consisting of titanium dioxide, gallium phosphide, gallium nitride, zinc oxide, tin dioxide, aluminum-doped zinc oxide, crystalline silicon, and silicon nitride.

6. The method of claim 1, wherein the substrate comprises silicon.

7. The method of claim 1, wherein the transparent layer comprises an oxide material.

8. The method of claim 1, wherein the portion of the substrate extending from the opening in the etch mask layer to the transparent layer is etched using an etchant comprising xenon difluoride, tetramethylammonium hydroxide, or potassium hydroxide.

9. The method of claim 1, wherein the substrate comprises silicon, the transparent layer comprises silicon dioxide, and the portion of the substrate extending from the opening in the etch mask layer to the transparent layer is etched using an etchant having a high selectivity to etch silicon compared to silicon dioxide.

10. The method of claim 1, wherein the plurality of nanostructures are formed using a nanoimprint stamp or a lithography process.

11. A method of forming an optical device, comprising:
providing a silicon on insulator substrate as a base, the silicon on insulator substrate comprising a handle layer, a buried oxide layer disposed on a first surface of the handle layer, and a device layer disposed on the buried oxide layer;
depositing an etch mask layer on a second surface of the handle layer opposite the first surface;
forming an opening in the etch mask layer to expose a portion of the second surface of the handle layer;
forming a plurality of nanostructures in the device layer over the opening in the etch mask layer;
depositing a protective layer over the plurality of nanostructures;
etching a portion of the handle layer extending from the opening in the etch mask layer to the buried oxide layer;
detaching a portion of the buried oxide layer having the plurality of nanostructures disposed thereon from the handle layer to form an optical device, the detached portion of the buried oxide layer being aligned with the opening in the etch mask layer; and
removing the protective layer.

12. The method of claim 11, wherein the buried oxide layer comprises an oxide material.

13. The method of claim 11, wherein the portion of the handle layer extending from the opening in the etch mask layer to the buried oxide layer is etched using an etchant comprising xenon difluoride.

14. The method of claim 11, wherein the handle layer comprises silicon, the buried oxide layer comprises silicon dioxide, and the portion of the handle layer extending from the opening in the etch mask layer to the buried oxide layer is etched using an etchant having a high selectivity to etch silicon compared to silicon dioxide.

15. The method of claim 11, wherein the plurality of nanostructures are formed using a nanoimprint stamp or a lithography process.

16. The method of claim 11, wherein the device layer is selected from a group consisting of crystalline silicon, silicon nitride, and amorphous silicon.

17. A method of forming an optical device, comprising:
providing a substrate as a base, the substrate comprising silicon;
depositing an etch mask layer on a first surface of the substrate;
forming an opening in the etch mask layer to expose a portion of the first surface of the substrate;
depositing a transparent layer on a second surface of the substrate, the second surface being opposite the first surface;
depositing a structure layer on the transparent layer, the structure layer comprising a material having a refractive index greater than about 1.8 and an absorption coefficient less than about 0.001;
forming a plurality of nanostructures in the structure layer over the opening in the etch mask layer;
depositing a protective layer over the plurality of nanostructures;
etching a portion of the substrate extending from the opening in the etch mask layer to the transparent layer; and
detaching a portion of the transparent layer having the plurality of nanostructures disposed thereon from the substrate to form an optical device, the detached portion of the transparent layer being aligned with the opening in the etch mask layer.

18. The method of claim 17, wherein the structure layer comprises a material selected from the group consisting of titanium dioxide, gallium phosphide, gallium nitride, zinc oxide, tin dioxide, aluminum-doped zinc oxide, crystalline silicon, and silicon nitride.

19. The method of claim 17, wherein the transparent layer comprises an oxide material, and wherein the protective layer is an encapsulation layer.

20. The method of claim 17, wherein the portion of the substrate extending from the opening in the etch mask layer to the transparent layer is etched using an etchant comprising xenon difluoride.

* * * * *